US011227971B2

(12) United States Patent
Yamaoka (10) Patent No.: US 11,227,971 B2
(45) Date of Patent: Jan. 18, 2022

(54) LIGHT EMITTING DEVICE HAVING LIGHT SHIELDING MEMBER FORMED IN RECESS OF COVER MEMBER AND METHOD FOR MANUFACTURING THE SAME

(71) Applicant: Nichia Corporation, Anan (JP)

(72) Inventor: Kensuke Yamaoka, Tokushima (JP)

(73) Assignee: Nichia Corporation, Anan (JP)

( * ) Notice: Subject to any disclaimer, the term of this patent is extended or adjusted under 35 U.S.C. 154(b) by 103 days.

(21) Appl. No.: 16/727,463

(22) Filed: Dec. 26, 2019

(65) Prior Publication Data

US 2020/0212255 A1 Jul. 2, 2020

(30) Foreign Application Priority Data

Dec. 28, 2018 (JP) .............................. JP2018-247903

(51) Int. Cl.
*H01L 33/00* (2010.01)
*H01L 33/58* (2010.01)
(Continued)

(52) U.S. Cl.
CPC ............ *H01L 33/0095* (2013.01); *F21K 9/90* (2013.01); *H01L 25/0753* (2013.01); *H01L 33/20* (2013.01); *H01L 33/58* (2013.01); *F21S 41/141* (2018.01); *F21Y 2115/10* (2016.08); *H01L 2933/0058* (2013.01)

(58) Field of Classification Search
CPC . H01L 33/0095; H01L 25/0753; H01L 33/20; H01L 33/58; H01L 2933/0058; H01L 33/52; H01L 33/505; H01L 2933/005; H01L 33/483; H01L 33/54;
(Continued)

(56) References Cited

U.S. PATENT DOCUMENTS 9,202,999 B2 * 12/2015 Kawano .................. H01L 33/58
2012/0235169 A1 9/2012 Seko et al.
(Continued)

FOREIGN PATENT DOCUMENTS

JP 2010-157638 A 7/2010
JP 2012-59939 A 3/2012
(Continued)

*Primary Examiner* — Tracie Y Green
(74) *Attorney, Agent, or Firm* — Birch, Stewart, Kolasch & Birch, LLP (57) ABSTRACT

A light emitting device manufacturing method includes: disposing n pieces of light emitting elements in m rows on a substrate block, where an interval between a kth light emitting element from one end of rows and a (k+1)th light emitting element has a first distance; disposing a phosphor member on the light emitting elements; disposing a frame member to surround the light emitting elements; disposing a cover member in each area surrounded by the frame member to cover lateral surfaces of the light emitting elements and the phosphor members while forming recesses at an upper surface between the kth light emitting elements and the (k+1)th light emitting elements apart by the first distance; disposing a light shielding member in each recess; and cutting the light shielding members, the cover members, and the substrate block between the light emitting elements that are apart by the first distance.

12 Claims, 7 Drawing Sheets

(51) Int. Cl.
*H01L 33/20* (2010.01)
*H01L 25/075* (2006.01)
*F21K 9/90* (2016.01)
*F21Y 115/10* (2016.01)
*F21S 41/141* (2018.01)

(58) Field of Classification Search
CPC .............. H01L 2933/0033; F21K 9/90; F21Y 2115/10; F21S 41/141
See application file for complete search history.

(56) References Cited

U.S. PATENT DOCUMENTS

| | | | |
|---|---|---|---|
| 2014/0027795 A1* | 1/2014 | Reiherzer | H01L 33/508 257/88 |
| 2014/0131753 A1* | 5/2014 | Ishida | H01L 23/3135 257/98 |
| 2015/0188004 A1* | 7/2015 | Ozeki | H01L 25/0753 257/98 |
| 2015/0262987 A1* | 9/2015 | Wada | H01L 33/46 257/98 |
| 2015/0280081 A1 | 10/2015 | Wada | |
| 2015/0340577 A1 | 11/2015 | Ishida et al. | |
| 2016/0293811 A1 | 10/2016 | Hussell et al. | |
| 2017/0154880 A1 | 6/2017 | Ozeki et al. | |
| 2018/0076368 A1 | 3/2018 | Hussell | |
| 2018/0182936 A1 | 6/2018 | Sajiki | |

FOREIGN PATENT DOCUMENTS

| | | |
|---|---|---|
| JP | 2014-112635 A | 6/2014 |
| JP | 2015-192105 A | 11/2015 |
| JP | 2017-108092 A | 6/2017 |
| JP | 2018-107170 A | 7/2018 |

* cited by examiner

LIGHT EMITTING DEVICE HAVING LIGHT SHIELDING MEMBER FORMED IN RECESS OF COVER MEMBER AND METHOD FOR MANUFACTURING THE SAME

CROSS-REFERENCE TO RELATED APPLICATION

This application claims priority to Japanese Patent Application No. 2018-247903, filed on Dec. 28, 2018, the disclosure of which is hereby incorporated by reference in its entirety.

BACKGROUND

The present disclosure relates to a light emitting device and a method for manufacturing the same.

LEDs are utilized in a broad range of applications. One of the applications is a light source for an automotive headlight. Considering the protection of oncoming drivers and pedestrians from glare, automotive headlights need to have a sharp cutoff line. For this reason, light sources designed for headlights need to achieve a sharp cutoff line when applied to headlights. For such a light source, Japanese Patent Publication 2012-59939, for example, proposes a high cutoff performance light emitting device achieved by disposing a light shielding member in the periphery of the light emission surface. The high cutoff performance in the patent publication refers to a large difference in luminance between the upper surface of the transparent member (i.e., light emission surface) and the periphery thereof, and the light emitting device disclosed in the patent publication is described as being able to provide a high performance headlight by way of appropriately designing the layout of light emitting elements and the shape of the transparent member.

SUMMARY

In the light emitting device proposed in the aforementioned patent publication, however, the light shielding member is disposed between the lateral surfaces of the transparent member and the outer frame. This makes it difficult to reduce the size of the device.

Accordingly, one object of the present disclosure is to provide a small sized light emitting device and a method of manufacturing a light emitting device.

A method of manufacturing a light emitting device according to certain embodiment of the present disclosure includes: disposing a plurality (n×m pieces) of light emitting elements on an upper surface of a substrate block arranged in m rows (m is an integer equal to or larger than 1), each row including n pieces (n is an even number equal to or larger than 2), where an interval between a kth (k is an odd number smaller than n) light emitting element from one end of rows and a (k+1)th light emitting element has a first distance; disposing a phosphor member on each light emission surface of the plurality (n×m pieces) of light emitting elements; disposing a frame member on the upper surface of the substrate block so as to surround the plurality (n×m pieces) of light emitting elements; disposing a cover member in each area surrounded by the frame member so as to cover lateral surfaces of the plurality (n×m pieces) of light emitting elements and lateral surfaces of the phosphor members while forming recesses at an upper surface between the kth light emitting elements and the (k+1)th light emitting elements which are separated by the first distance; disposing a light shielding member in each of the recesses; and dividing into individual light emitting devices by cutting the light shielding members, the cover members, and the substrate block between the light emitting elements that are separated by the first distance.

A light emitting device according to certain embodiment of the present disclosure includes: a substrate; a light emitting element disposed on an upper surface of the substrate; a phosphor member having a quadrilateral upper surface and a lower surface opposing the quadrilateral upper surface, and disposed such that the lower surface faces a light emission surface of the light emitting element; a cover member disposed to cover lateral surfaces of the light emitting element and lateral surfaces of the phosphor member while exposing an upper surface of the phosphor member; and a light shielding member disposed on an upper surface of the cover member along a portion of a perimeter of the upper surface of the phosphor member. A portion of the cover member on which the light shielding member is disposed has a height from an upper surface thereof to the upper surface of the substrate so as to be lower closer to an outer edge side than on a phosphor member side.

The embodiments of the present disclosure described above can provide a small sized light emitting device and a method of manufacturing a light emitting device.

DESCRIPTION

Certain embodiments and examples of the present disclosure will be explained below with reference to the drawings. The light emitting devices explained below are for giving shape to the technical ideas of the present invention, and are not intended to limit the present invention unless otherwise specifically noted.

In each drawing, the same reference numerals denote the members having the same functions. To make the features easily understood, the descriptions of the features are distributed among the embodiments and examples, but the constituent elements described in different embodiments and examples can be replaced or combined in part. The explanation of common features already described in embodiments or examples appearing earlier might be omitted in the subsequent embodiments or examples where the explanation is focused only on the differences. Similar effects attributable to similar features, in particular, will not be mentioned each time an embodiment or example is discussed. The sizes of and positional relationships between the members shown in each drawing might be exaggerated for clarity of explanation.

For example, when employed as the light source of a headlight, the light emitting device according to an embodiment of the present disclosure needs to be small sized and capable of achieving a sharp cutoff line. It is proposed that manufacturing a light emitting device having a quadrilateral light emission surface such that the luminance sharply changes between the inside and the outside of the boundary between the light emission surface and the cover member surrounding the perimeter of the light emission surface at least along one side of the light emission surface. Such light emitting device can have a sharp cutoff line with a simple configuration of an optical system when employed as the light source of a headlight. For example, when at least one side of a quadrilateral light emission surface becomes the boundary where the luminance sharply changes, by appropriately designing an optical system to control the emitted light from the light emitting element, a sharp cutoff line can be achieved when used as the light source of a headlight even if the luminance change is not sharp at the boundary along the other sides.

Light emitting devices of certain embodiments will be specifically explained below.

Embodiment 1

Figure 1:
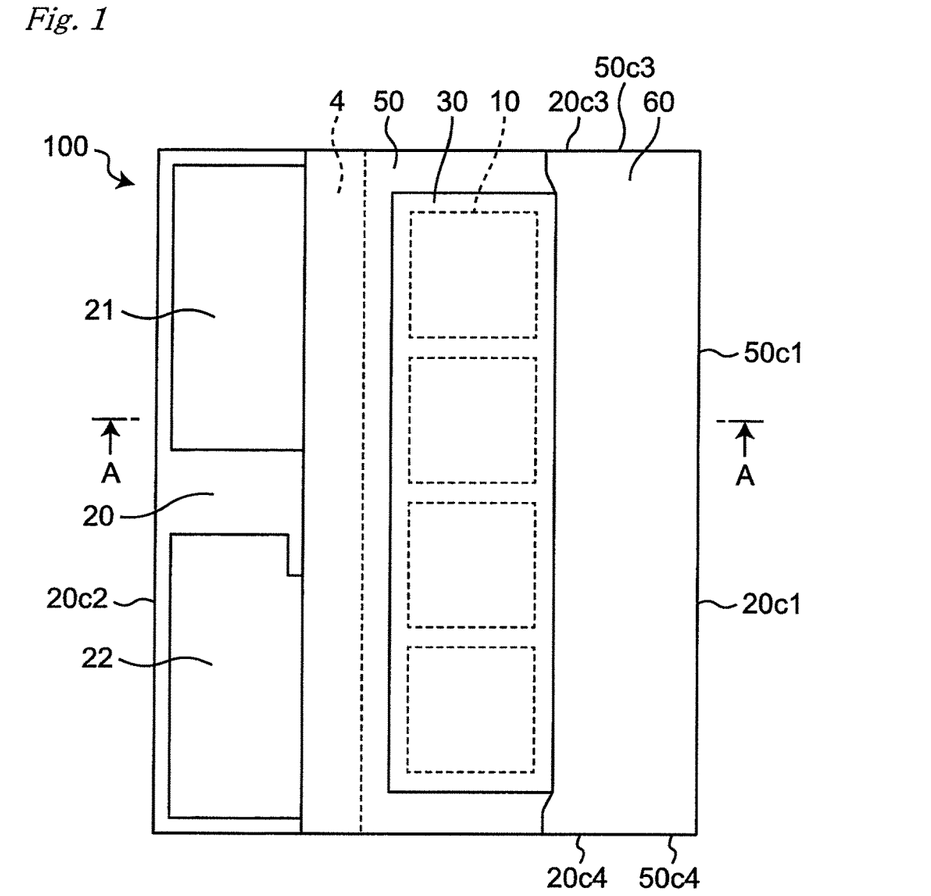
FIG. 1 is a schematic top view of a light emitting device according to Embodiment 1.
Figure 2:
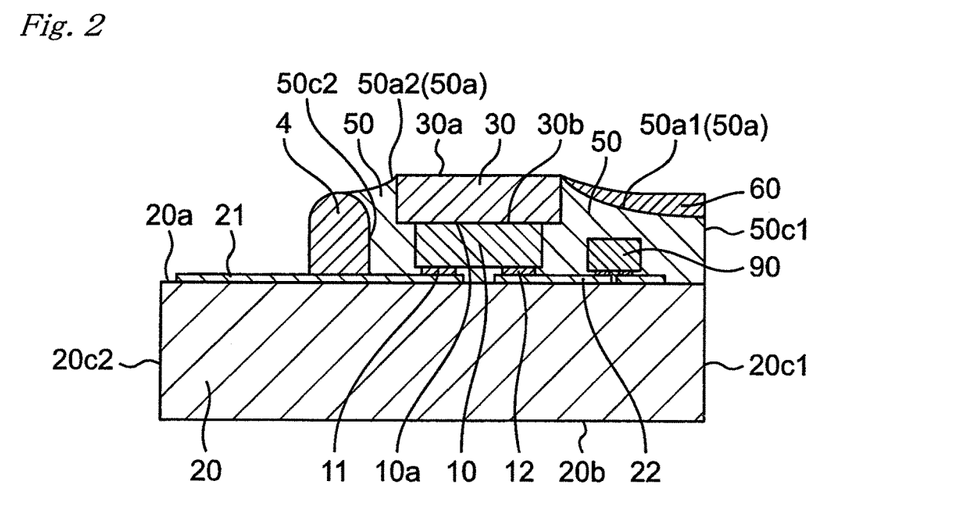
FIG. 2 is a schematic cross-sectional view taken along line A-A in FIG. 1.

FIG. 1 is a schematic top view of a light emitting device 100 according to Embodiment 1, and FIG. 2 is a schematic cross-sectional view taken along line A-A in FIG. 1.

The light emitting device 100 according to Embodiment 1 includes a substrate 20, four light emitting elements 10 disposed on the upper surface 20a of the substrate 20, a phosphor member 30, a cover member 50, and a light shielding member 60. The phosphor member 30 has a substantially quadrilateral upper surface and a lower surface which opposes the upper surface, and is disposed such that the lower surface faces the light emission surfaces 10a of the four light emitting elements 10. The light shielding member 60 is disposed on the upper surface of the cover member 50 along a portion of the perimeter of the upper surface of the phosphor member 30. The portion of the upper surface of the cover member 50 on which the light shielding member 60 is disposed has a height from the upper surface thereof to the upper surface of the substrate 20 so as to be lower on the outer edge side than on the phosphor member side.

In the present embodiment, the cover member 50 is made of a material having reflectivity, and the light shielding member 60 is made of a material having higher reflectivity than that of the cover member 50.

In the light emitting device 100 of Embodiment 1 described above, the lateral surfaces of the four light emitting elements 10 and the lateral surfaces of the phosphor member 30 are covered with the cover member 50 which has high reflectivity. Thus, the light subjected to wavelength conversion by the phosphor member 30, or such converted wavelength light in combination with a portion of the light emitted by the light emitting elements 10, is output from the upper surface (i.e., light exiting surface) of the phosphor member 30 which is the light emission surface of the light emitting device 100.

Furthermore, in the light emitting device 100 of Embodiment 1, a light shielding member 60 is further disposed on the cover member 50 along a portion of the perimeter of the upper surface of the phosphor member 30. Thus, the light leaking from the upper surface of the cover member 50 can be blocked by the light shielding member 60 to thereby increase the luminance difference between the light emission surface and non-light emission surface of the light emitting device 100 on the light exiting surface side.

In the case of employing the light emitting device 100 of Embodiment 1, which can sharply reduce the luminance in a region adjacent to the perimeter of the light exiting surface, for example, as the light source of a headlight, a sharp cutoff line can be achieved by suitably designing an optical system that can optically control the light exiting from the light emitting device with a relatively simple structure.

A specific example of the light emitting device of Embodiment 1 and its constituent elements will be explained in more detail below with reference to the drawings.

Substrate 20

The substrate 20 is a member on which light emitting elements 10 are mounted, and externally electrically connects the light emitting device. The substrate 20 has a quadrilateral upper surface 20a and a lower surface 20b each having long and short sides. Furthermore, a first electrode 21 and a second electrode 22 are formed on the upper surface 20a of the substrate 20. Four light emitting elements 10 each have a quadrilateral upper surface and a lower surface opposing the upper surface, where the upper surface serves as a primary light emission surface 10a and the lower surface has a first electrode 11 and the second electrode 12. The four light emitting elements 10 are lined up on the upper surface 20a of the substrate 20 along the long sides of the upper surface 20a. In the present embodiment, in the light emitting device of Embodiment 1, the light emitting elements 10 are disposed such that one side of each upper surface (i.e., each light emission surface 10a) is positioned on a straight line (i.e., first straight line) paralleling the long sides of the upper surface 20a of the substrate 20, and each opposing side is positioned on a second straight line paralleling the first straight line. The light emitting elements 10 are serially or parallelly connected between the first electrode 21 and the second electrode 22 of the substrate 20 via the first electrodes 11 and the second electrodes 12. In the light emitting device 100 of Embodiment 1, a protective element 90 is disposed on the upper surface 20a of the substrate 20. The protective element 90 is disposed in the area directly under the light shielding member 60.

The main material for the substrate 20 preferably employs an insulating material that does not readily transmit the light from the light emitting elements or the external light. Specific examples include ceramics such as alumina, aluminum nitride, or the like, and resins such as phenol resins, epoxy resins, polyimide resins, BT resin, polyphthalamide, and the like. In the case of using a resin, an inorganic filler, such as glass fibers, silicon oxide, titanium oxide, alumina, or the like, may be mixed into the resin as needed. This can enhance the mechanical strength, reduce the thermal expansion coefficient, and increase the optical reflectance. Alternatively, the substrate 20 may be a metal material on which an insulating material is formed on. The first electrode 21 and the second electrode 22 in a predetermined pattern are formed on the insulating material. For the electrode material, at least one selected among gold, silver, copper and aluminum can be used. The wiring can be formed by plating, vapor deposition, sputtering, or the like.

Light Emitting Element 10

Light emitting diodes are preferably used for the light emitting elements 10. One having any wavelength can be selected. For example, for a blue or green light emitting element, one employing a nitride-based semiconductor ($In_XAl_YGa_{1-X-Y}N$, $0 \leq X$, $0 \leq Y$, $X+Y \leq 1$), ZnSe, or GaP can be used. For a red light emitting element, GaAlAs, AlInGaP, or the like can be used. Semiconductor light emitting elements made of materials other than these can alternatively be used. The composition, emission color, size, or number of the light emitting elements employed can be suitably selected in accordance with the purpose. Suitable examples of the materials used in a light emitting device having a phosphor include nitride semiconductors ($In_XAl_YGa_{1-X-Y}N$, $0 \leq X$, $0 \leq Y$, $X+Y \leq 1$) which can efficiently excite the phosphor and emit light having a short wavelength. Various emission wavelengths can be selected depending on the semiconductor materials and the mixed crystal composition ratio.

The light emitting elements 10 have positive and negative electrodes, for example, on the same surface, and are flip-chip mounted on the substrate 20 with the positive and negative electrode side facing down as shown in FIG. 2. Each light emitting element 10 uses the upper surface, which opposes the lower surface having the electrodes, as the principal light exiting surface. Such a light emitting element 10, as described above, is connected on the substrate using a conductive bonding material, such as bumps, conductive paste, or the like. This can provide large contact areas between the electrodes and the substrate to thereby reduce the interconnection resistance, as compared to a light emitting element connected using metal wires.

The light emitting element 10 is, for example, one formed on a light transmissive support substrate on which nitride semiconductor layers are formed, and the support substrate side becomes the upper surface, which is the principal light exiting surface, of the light emitting element 10. The support substrate can be removed. The removal of the support substrate can be performed, for example, by polishing, LLO (laser lift off), or the like.

Phosphor Member 30

The phosphor member 30 is a plate-like member having an upper surface 30a and a lower surface 30b each having long and short sides. The phosphor member 30 is disposed such that the lower surface 30b faces and collectively covers the light emission surfaces 10a of the four light emitting elements 10. The upper surface 30a and the lower surface 30b of the phosphor member 30, for example, have the same shape. The lengths of the long sides of the phosphor member 30 are, for example, set to be larger than the distance between the outer sides of the light emission surfaces 10a of the two outermost light emitting elements 10 among the array of four light emitting elements 10. The lengths of the short sides of the phosphor member 30 are set to be larger than one side of the light emission surface 10a of a light emitting element 10. In the light emitting device 100 of Embodiment 1, the phosphor member 30 described above is disposed such that (i) one of the long sides is positioned outward of the first straight line, and the other one of the long sides which opposes to the side closer to the first straight line is outward of the second straight line in each light emission surface 10a, and (ii) the short sides are positioned outward of the outer sides of the two outermost light emitting elements 10.

Examples of materials used for the phosphor member 30 include a sintered body of phosphor, or phosphor powder-containing body formed using a resin, glass, ceramic or other inorganic materials. Alternatively, the phosphor member may be a formed using resin, glass, ceramic, or the like having a phosphor-containing layer formed on the surface. The phosphor member may contain a filler such as a light diffuser depending on the purpose. The phosphor member has a flat plate shape, for example, and the thickness thereof can be in a range of about 50 µm to about 300 µm.

The phosphor contained in the phosphor member is excitable by the emitted light from the light emitting elements 10. Examples of phosphors excitable by a blue or ultraviolet light emitting element include cerium-activated yttrium aluminum garnet-based phosphors (YAG:Ce); cerium-activated lutetium aluminum garnet-based phosphors (LAG:Ce); europium and/or chromium-activated nitrogen-containing calcium aluminosilicate-based phosphors ($CaO-Al_2O_3-SiO_2$); europium-activated silicate-based phosphors ($(Sr,Ba)_2SiO_4$); nitride-based phosphors such as β-SiAlON, CASN-based phosphors, SCASN-based phosphors; KSF-based phosphors ($K_2SiF_6$:Mn); sulfide-based phosphors, quantum dot phosphors, and the like. By combining these phosphors with a blue or ultraviolet light emitting element, a light emitting device of various emission colors (e.g., a white light emitting device) can be manufactured.

Frame Member

In the light emitting device 100 of Embodiment 1, a frame member 4 is disposed on the upper surface 20a of the substrate 20. The frame member 4 partitions the upper surface into a first region and a second region. The first region is a region where the four light emitting elements 10, the phosphor member 30, and the protective element 90 are disposed. The second region is a region where a portion of the first electrode 21 and a portion of the second electrode 22 are exposed. The frame member 4 is made of a material having high reflectivity, for example, a resin in which a light diffuser is dispersed. The portion of the first electrode 21 and the portion of the second electrode 22 exposed in the second region serve as external connection terminals of the light emitting device 100.

The frame member 4 can be formed by using, for example, a resin material. Examples of usable resin material include a silicone resin, modified silicone resin, epoxy resin, modified epoxy resin, acrylic resin, or the like. The resin material used to form the frame member may be a light transmissive resin, a white resin containing a light reflecting substance, or a black resin containing a light-absorbing substance.

The frame member 4 can be formed using ceramic or resin and bonded to the substrate 20. Alternatively, the frame member 4 may be integrally formed with the substrate 20.

The frame member 4 is preferably disposed such that the upper edge of the frame member 4 is higher than the light emitting elements 10, but lower than the upper surface of the phosphor member 30. This can inhibit the cover member 50 from running onto the upper surface of the phosphor member 30 when disposing the cover member 50 in the first region. Accordingly, interruption of light output that would be caused by running of the cover member 50 on the phosphor member 30 can be inhibit.

Cover Member 50

The cover member 50 is disposed in the first region of the upper surface 20a of the substrate 20 to cover the lateral surfaces of the four light emitting elements 10 and the lateral surfaces of the phosphor member 30 while exposing the upper surface of the phosphor member 30. In other words, the four light emitting elements 10, the phosphor member 30 and the protective element 90 if included disposed in the first region of the upper surface 20a of the substrate 20 are embedded in the cover member 50 while the upper surface of the phosphor member 30 is exposed. Because the light emitting device 100 of Embodiment 1 is manufactured by the method described later, for example, the first lateral surface 50c1, the third lateral surface 50c3, and the fourth lateral surface 50c4 of the cover member 50 (i.e., lateral surfaces except for the second lateral surface 50c2 that is in contact with the frame member 40) are positioned coplanar with the lateral faces of the substrate 20 respectively positioned directly thereunder. Specifically, the first lateral surface 50c1 is positioned coplanar with the first lateral surface 20c1 of the substrate 20, the third lateral surface 50c3 is positioned coplanar with the third lateral surface 20c3 of the substrate 20, and the fourth lateral surface 50c4 is positioned coplanar with the fourth lateral surface 20c4 of the substrate 20. Being manufactured by the method described later, the upper surface 50a of the cover member 50 includes a first upper surface 50a1, a second upper surface 50a2, and third upper surfaces all having different planar directions. In the upper surface 50a of the cover member 50, the first upper surface 50a1 is the region between the long side on the first lateral surface 50c1 side and the side of the phosphor member 30 closer to the first lateral surface 50c1 side, the second upper surface 50a2 is the region between the long side on the second lateral surface 50c2 side and the side of the phosphor member 30 on the second lateral surface 50c2 side, and the third upper surfaces 50a3 are the upper surface 50a excluding the first upper surface 50a1 and the second upper surface 50a2. In the light emitting device 100 of Embodiment 1 manufactured by the method described later, the height of the first upper surface 50a1 from the upper surface 20a of the substrate 20 is lower on the outer edge side (i.e., on the first lateral surface 50c1 side) than on the phosphor member 30 side.

The cover member 50 can be formed, for example, of a resin material containing a light reflecting substance. The cover member 50 preferably has a reflectance of at least 60%, more preferably at least 80%, particularly preferably at least 90%, for the wavelength of the light emitted by the light emitting elements 10.

For the base resin for the cover member, a silicone resin, modified silicone resin, epoxy resin, modified epoxy resin, acrylic resin, or hybrid resin containing at least one of these resins can be used. The cover member can be formed by allowing a base material made of these resins to contain a light reflecting substance. For the light reflecting substance, an oxide containing any of Ti, Zr, Nb, Al, and Si, or AlN, MgF, or the like can be used. Preferably, titanium dioxide ($TiO_2$) is used. Preferably, light reflecting particles having a different refractive index from that of the base resin is dispersed in the base resin. The light reflection amount and light transmittance amount differ depending on the concentration and density of the light reflecting substance contained in the resin. The concentration and density of the light reflecting substance can be suitably adjusted in accordance with the shape and size of the light emitting device.

Light Shielding Member 60

The light shielding member 60 is partially disposed on the first upper surface 50a1 of the cover member 50. In the upper surface 50a of the cover member 50, the light shielding member 60 is partially disposed along the side of the phosphor member 30 on the side closer to the first lateral surface 50c1. The light shielding member 60 can be formed, for example, with a resin material containing a light shielding filler. For the base resin material, a silicone resin, modified silicone resin, epoxy resin, modified epoxy resin, acrylic resin, or the like can be used. Examples of light shielding fillers include light-absorbing substances, such as pigments, carbon black, and the light reflecting substances described earlier. Among such examples, a black resin containing a light-absorbing substance such as carbon black is preferably used for the light shielding member 60. The light shielding member 60 having a black colored body can absorb stray light such as return light, to thereby reduce such light to be externally released again. This can also increase the contrast with external light.

The thickness of the light shielding member 60 covering the upper surface of the cover member 50 is set so as to become thicker as the distance from the phosphor member 30 increases. In other words, a portion of the cover member on which the light shielding member is disposed has a height from the upper surface thereof to the upper surface of the substrate decreases as the distance from the phosphor member increases. This can increase the thickness of the light shielding member while securing the distance between the light shielding member and the lateral surface of the phosphor member, thereby reducing the light loss attributable to disposing of the light shielding member while blocking the light leaking from the upper surface of the cover member 50. This can result in increasing the luminance difference between the light emission surface and the non-light emission surface of the light emitting device 100 on the light exiting side.

In the light emitting device 100 of Embodiment 1 described above, the lateral surfaces of the four light emitting elements 10 and the lateral surfaces of the phosphor member 30 are covered with the cover member 50 having a high reflectivity. This can reduce the output of light from the upper surface of the cover member 50, thereby allowing the device to primarily output light from the upper surface (i.e., light exiting surface) of the phosphor member 30. Even when a high reflective cover member 50 is used, however, the light exiting from the lateral surfaces of the light emitting elements 10 and the lateral surfaces of the phosphor member 30 can leak from the upper surface 50a of the cover member 50, particularly from the vicinity of the boundary with the phosphor member 30. This can make the light exiting surface to be appeared larger than it is, making the light exiting surface appear spreading beyond the boundary between the upper surface of the phosphor member 30 and the upper surface 50a of the cover member 50, in other words, the boundary cannot be a so-called sharp-edged boundary. If such a light emitting device having no sharp-edged boundary is employed for a headlight requiring a sharp cutoff line, an optical system that can achieve a sharp cutoff line by controlling the irradiation direction of the light exiting from the light emitting device is needed, resulting in a complex optical system.

Accordingly, in the case of the light emitting device 100 of Embodiment 1, a light shielding member is disposed on the upper surface 50a of the cover member 50 along the side of the phosphor member 30 closer to the first lateral surface 50c1 side. This can make the boundary of the phosphor member 30 appear sharp-edged in the vicinity along that side of the phosphor member 30, and when used as the light emitting device for a headlight, a sharp cutoff line can be achieved with a relatively simple optical system.

In the upper surface 50a of the cover member 50, moreover, it is preferable to reduce the distances from the phosphor member 30 to the third lateral surface 50c3 and the fourth lateral surface 50c4, to thereby make the boundary of the phosphor member 30 appear sharp-edged in the vicinities of the third lateral surface 50c3 and the fourth lateral surface 50c4. The thickness of the cover member covering the lateral surfaces of the phosphor member 30 in this case, in other words, the distance between the phosphor member 30 and the third lateral surface 50c3 or the fourth lateral surface 50c4 in a top view, is preferably set to about 100 μm to about 400 μm. Although the reduced thickness of the cover member covering these lateral surfaces of the phosphor member may cause light leakage from the lateral surfaces, the third lateral surface and the fourth lateral surface can become the boundaries where the luminance sharply changes on the light emission surface side.

Next, a method of manufacturing a light emitting device according to Embodiment 1 will be explained with reference to FIG. 3, and FIGS. 4A to 4G.

Figure 3:
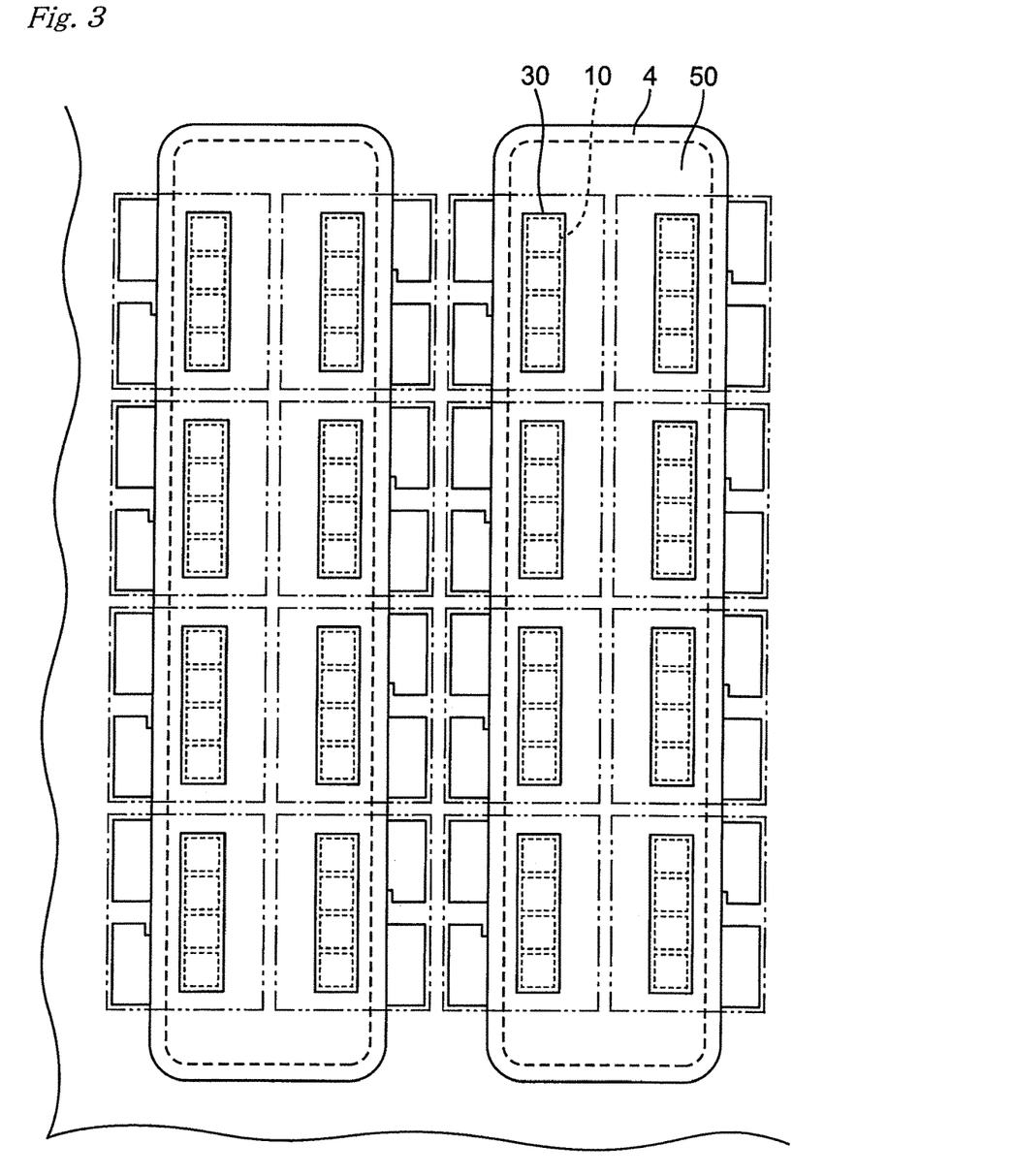
FIG. 3 is a plan view after disposing a cover member in a method of manufacturing the light emitting device according to Embodiment 1.
Figure 4:
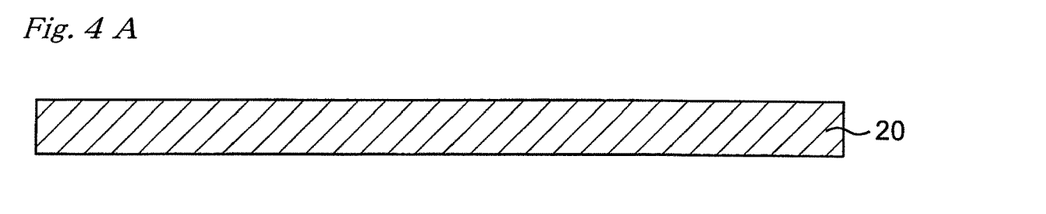
FIG. 4A is a cross-sectional view of a substrate block used in the method of manufacturing a light emitting device according to Embodiment 1.
FIG. 4B is a cross-sectional view after disposing light emitting elements in the method of manufacturing a light emitting device according to Embodiment 1.
FIG. 4C is a cross-sectional view after disposing protective elements in the method of manufacturing a light emitting device according to Embodiment 1.
FIG. 4D is a cross-sectional view after disposing phosphor members in the method of manufacturing a light emitting device according to Embodiment 1.
FIG. 4E is a cross-sectional view after disposing frame members in the method of manufacturing a light emitting device according to Embodiment 1.
FIG. 4F is a cross-sectional view after disposing cover members in the method of manufacturing a light emitting device according to Embodiment 1.
FIG. 4G is a cross-sectional view after disposing light shielding members in the method of manufacturing a light emitting device according to Embodiment 1.

FIGS. 4A to 4G are schematic cross-sectional views each showing a process in the method of manufacturing a light emitting device according to Embodiment 1, and FIG. 3 is a top view of what is shown in FIG. 4F.

The method of manufacturing a light emitting device of Embodiment 1 includes a light emitting element disposing process (FIG. 4B), a protective element disposing process (FIG. 4C), a phosphor member disposing process (FIG. 4D), a frame member disposing process (FIG. 4E), a cover member disposing process (FIG. 4F), a light shielding member disposing process (FIG. 4G), and a dividing process.

In FIG. 3 and FIGS. 4A to 4G, the same reference numerals denote the same members before and after the light emitting devices are divided into individual pieces.

Light Emitting Element Disposing Process

In the light emitting element disposing process, a substrate block 20 on which a number of individual light emitting device regions are arranged is provided (FIG. 4A). On the upper surface of the substrate block 20, a plurality of (n×m) pieces of light emitting elements are arranged in "m" rows (m is 1 an integer equal to or larger than 1) each including "n" pieces (n is an even number equal to or larger than 2). In the present embodiment, in each row, the n pieces of light emitting elements are disposed such that the interval between a "k"th light emitting element from one end (k is an odd number smaller than n) and the (k+1)th light emitting element is a first distance D1. In the example of Embodiment 1 shown in FIG. 3, the interval between the light emitting elements 10 arranged in the first column, i.e., the column at one end, and the light emitting elements 10 arranged in the second column, and the interval between the light emitting elements 10 arranged in the third column the light emitting elements 10 arranged in the fourth column from that end and, each have the first distance D1. Four columns each having 16 light emitting elements 10 are shown in FIG. 3. In the example shown in FIG. 3, n is 2 and m is 16. In other words, in this disclosure, n and m are defined by the number and the layout of the light emitting elements 10 surrounded by a frame member 4, and in FIG. 3, two groups of (n×m) pieces of light emitting elements are shown.

In the manufacturing method according to Embodiment 1, each light emitting device includes four light emitting elements 10. Thus, in each column, the four light emitting elements 10 included in a light emitting device are closely arranged at equal intervals, and a larger interval is provided between the light emitting elements 10 located at the opposing ends of two adjacent light emitting devices. The distance between the light emitting elements 10 in each light emitting device is, for example, about 100 μm to about 200 μm.

Protective Element Disposing Process

In the manufacturing method according to Embodiment 1, protective elements 90 are disposed on the substrate block for the light emitting elements 10 (FIG. 4C). The protective elements 90 are disposed, for example, between the lateral surface of a kth light emitting element and the lateral surface of the (k+1)th light emitting element 10 facing the kth light emitting element, in each row. In other words, the protective elements 90 are disposed between a kth light emitting element and the (k+1)th light emitting element so that the protective element 90 for the kth light emitting element and the protective element 90 corresponding to the (k+1)th light emitting element are next to each other. For example, in the dividing process, they are divided between the two protective elements 90 next to each other.

Phosphor Member Disposing Process

In the phosphor member disposing process, phosphor members 30 are disposed on each light emission surface of the plurality of (n×m) pieces of light emitting elements (FIG. 4D). The phosphor members 30 are bonded by using, for example, a light transmissive bonding member such as a silicone resin. In the case of composing the phosphor member 30 with a crystalline material, they can be bonded by, for example, thermocompression bonding.

Frame Member Disposing Process

In the frame member disposing process, frame members 4 each collectively surrounding (n×m) pieces of light emitting elements 10 are disposed on the upper surface of the substrate block 20. For example, in the example shown in FIG. 3, two frame members 4 each collectively surrounds 16 pieces by 2 columns of light emitting elements 10 (FIG. 4E). In the manufacturing method according to Embodiment 1, the frame members 4 are specifically disposed such that each frame member 4 forms the boundary between the first region that includes the light emission region and the second region that includes the external connection region in each of the regions that will become light emitting devices following the dividing process. Specifically, a frame member 4 is disposed such that the first region where the four light emitting elements 10, the phosphor member 30, and the protective element 90 of each device will be located inward of the frame member 4, and the second region which includes a portion of the first electrode 21 and a portion of the second electrode 22 will be located outward of the frame member 4. In other words, the frame members 4 are formed to each collectively surround the first regions of the light emitting device regions disposed in a kth column and the first regions of the light emitting device regions disposed in the (k+1)th column. Forming frame members 4 in this manner can simplify the cover member disposing process described later which disposes cover members only in the first regions surrounded by the frame members 4 of the regions that will become light emitting devices after being divided into individual pieces.

For example, the frame members 4 are preferably formed to be lower than the upper surfaces of the phosphor members 30 as shown in FIG. 4E. The frame members 4 can be formed with a resin material or the like. For the resin material, for example, a thermosetting resin, such as a silicone resin, epoxy resin, or the like, is used. The resin is applied on the substrate 20 by using a dispenser or the like, and hardened. The resin material for the frame members 4 preferably contains a light reflecting material. This allows a frame member 4 to reflect the light exiting from the lateral surfaces of the light emitting elements 10 and the lateral surfaces of the phosphor member 30 of a device to exit from the upper surface of the phosphor member 30 (light emission surface) even when the cover member 50 is formed in a reduced space by shortening the distances from the frame member 4 to the light emitting elements and the phosphor members 30. This can increase the light extraction efficiency and further reduce the size of the light emitting device.

Cover Member Disposing Process

In the cover member disposing process, a cover member is disposed in the region surrounded by each frame member 4 so as to cover the lateral surfaces of the (n×m) pieces of light emitting elements and the lateral surfaces of the phosphor members while exposing the upper surfaces of the phosphor members. The cover member forms curved recesses at the upper surface between kth light emitting elements and the (k+1)th light emitting elements which are apart by the first distance (FIG. 4F). In the cover member disposing process, for example, a resin material employed to form the cover members is disposed on the substrate upper surface between the frame members 4 and the phosphor members in a top view so as to expose the surfaces of the phosphor members 30 in each frame member 4. Suitably adjusting the viscosity and the injection amount of the resin material to inject the resin material allows the resin material to wet and spread up to the upper edges of the lateral surfaces of the phosphor members 30. The cover member can form a curved recess by the surface tension of the resin material at the upper surface between a kth light emitting element and the (k+1)th light emitting element which are apart by the first distance in each row. The depth (i.e., degree of curvature) of a curved recess formed at the upper surface between a kth light emitting element and the (k+1)th light emitting element in each row can be determined by adjusting the viscosity and the injection amount of the resin. Accordingly, the viscosity and the injection amount of the resin are set by taking into consideration the required thickness of the light shielding members 60 formed in the subsequent process.

The recesses formed at the upper surface between kth light emitting elements and (k+1)th light emitting elements are continuously formed in the column direction in the form of a groove between the light emitting elements arranged in the kth column and the light emitting elements arranged in the (k+1)th column. The recesses formed between the kth light emitting elements arranged in the kth column and the (k+1)th light emitting elements arranged in the (k+1)th column which are continuously formed over the plurality of rows will hereinafter be referred to as a groove. In the example shown in FIG. 3, grooves each having a curved surface are respectively formed at the surface between the light emitting elements 10 arranged in the first column and the light emitting elements 10 arranged in the second column, and between the light emitting elements 10 arranged in the third column and the light emitting elements 10 arranged in the fourth column.

Light Shielding Member Disposing Process

In the light shielding member disposing process, light shielding members are disposed in the recesses formed in each row on the upper surface of the cover member between a kth light emitting element and the (k+1)th light emitting element which are apart by the first distance (FIG. 4G). In the case where a groove is formed between a kth column and the (k+1)th column, a continuous strip-shaped light shielding member is disposed in the groove. In disposing a light shielding member in a recess or groove, for example, a dispenser or the like can be used to dispose an uncured resin material that will become the light shielding member in the recess or groove. It is preferable to dispose the light shielding member in a recess or groove such that the ends of the light shielding member closer to the phosphor members 30 substantially coincide with the edges of the upper surfaces of the phosphor members 30. Specifically, in the case of using a resin material for the light shielding member, for example, the viscosity and the injection amount of the resin material to be injected are adjusted such that the ends of the resin material disposed in the recess coincide with the upper edges of the phosphor members 30 while achieving a thickness that can ensure a predetermined light shielding rate. In the case where a predetermined thickness of the light shielding member can be ensured, the surface of the light shielding member after hardening the resin can be curved downward along the surface of the recess as shown in FIG. 4G. In this case, the viscosity of the resin material to be injected can be set relatively low to allow the injected resin to creep up to the edges of the phosphor members 30.

In the case in which the light shielding member needs to have a large thickness, the light shielding member may have a surface that is convex upward. In this case, the viscosity of the resin material to be injected can be set relatively high to allow the edges of the injected resin to stop at the edges of the phosphor members 30.

Dividing Process

In the dividing process, individual light emitting devices can be obtained by being split along the cut lines as indicated by the two-dot chain lines in FIG. 3 that define the regions that become individual light emitting devices.

Specifically, the dividing process includes cutting of the light shielding member, the cover member, and the substrate in the center of the light emitting elements facing each other which are apart by the first distance D1. In the individual light emitting devices 100 after being divided, a portion of the cover member 50 on which the light shielding member 60 is disposed has a height from the upper surface thereof to the upper surface of the substrate 20 such that the outer edge side is lower than the phosphor member 30 side.

A light emitting device of Embodiment 1 can be manufactured by performing the processes descried above.

Embodiment 2

Figure 5:
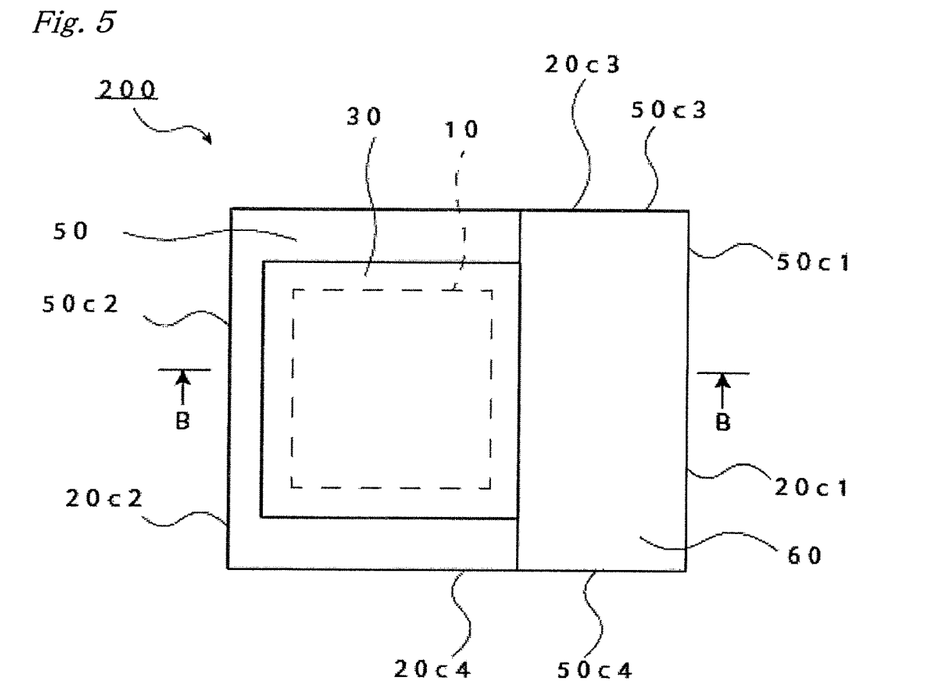
FIG. 5 is a schematic top view of a light emitting device according to Embodiment 2.
Figure 6:
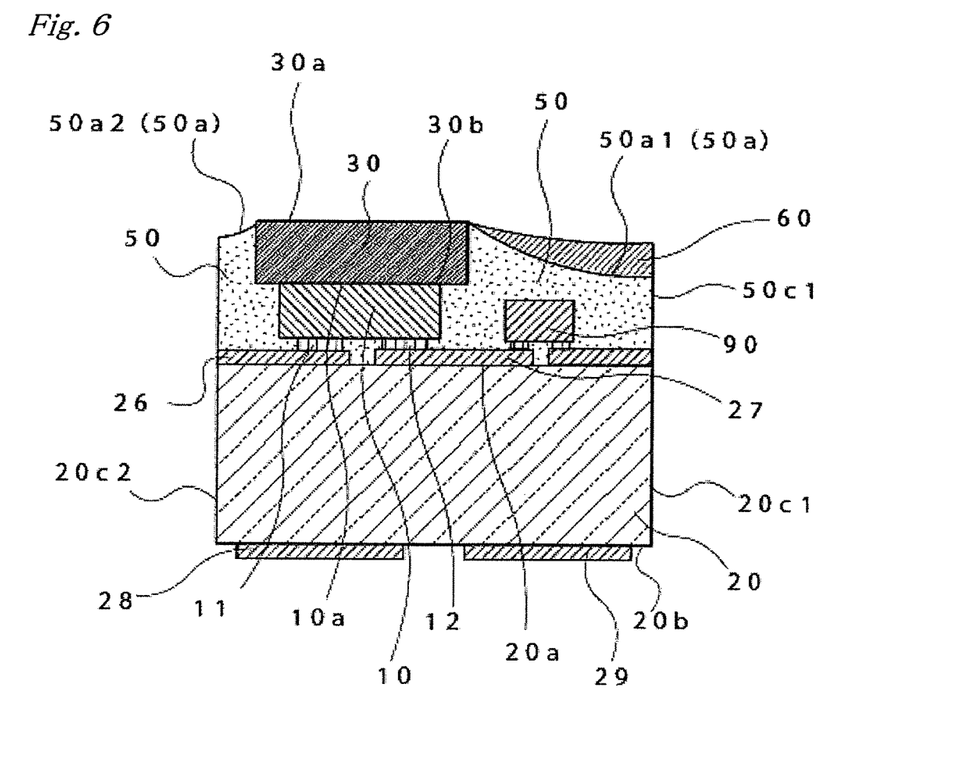
FIG. 6 is a schematic cross-sectional view taken along ling B-B in FIG. 5.
Figure 7:
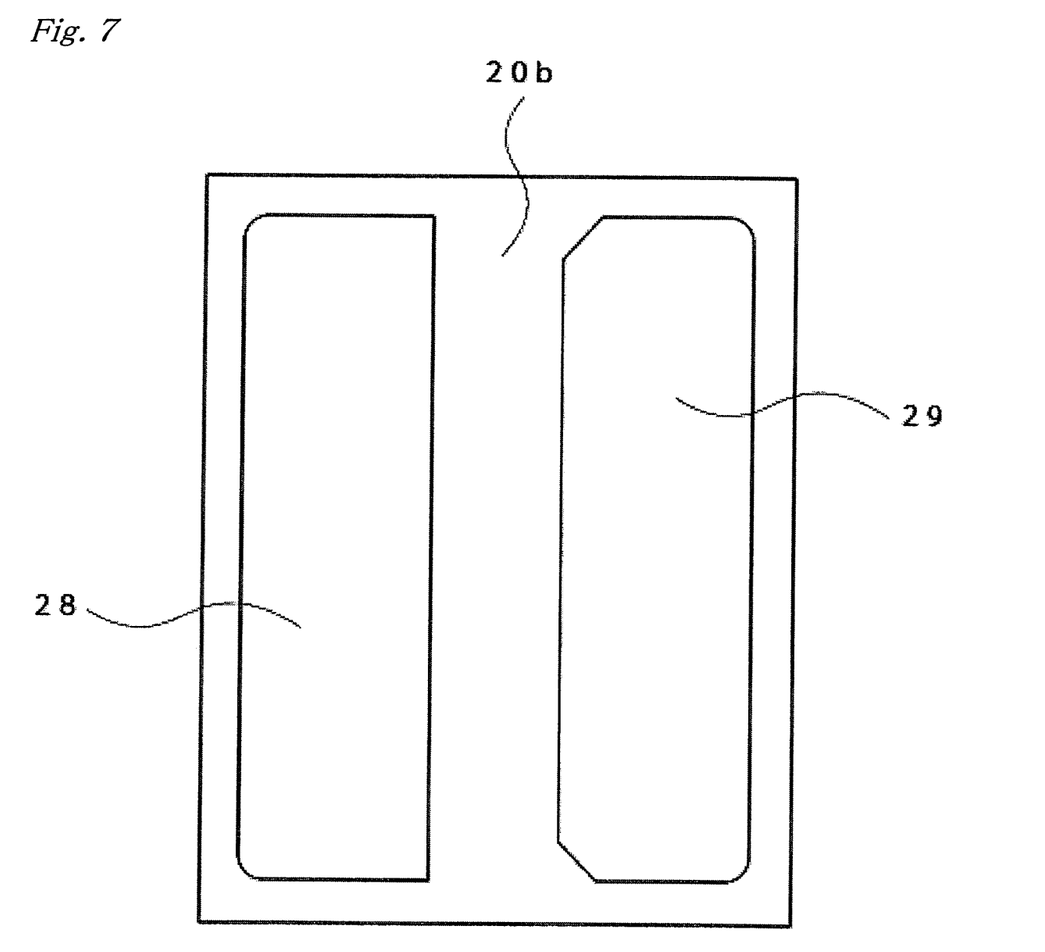
FIG. 7 is a bottom view of the light emitting device shown in FIG. 5.

FIG. 5 is a schematic top view of a light emitting device 200 according to Embodiment 2. FIG. 6 is a schematic cross-sectional view taken along line B-B in FIG. 5. FIG. 7 is a schematic bottom view of the device shown in FIG. 5. The same members as those in Embodiment 1 are denoted by the same reference numerals.

The light emitting device 200 of Embodiment 2, as shown in FIGS. 5 and 6, is different from the light emitting device 100 of Embodiment 1 such that (1) each device has one light emitting element 10 and one phosphor member, (2) a third electrode 28 and a fourth electrode 29, which are external connection electrodes, are disposed on the lower surface 20b of the substrate 20, and (3) a frame member is not included.

The light emitting device 200 of Embodiment 2 will be explained in detail below.

The light emitting device 200 of Embodiment 2 includes a substrate 20, a single light emitting element 10 disposed on the upper surface 20a of the substrate 20, and a single phosphor member 30. The phosphor member 30 has a quadrilateral upper surface and a lower surface, and is disposed such that the lower surface faces and covers the light emission surface 10a of the light emitting element 10.

The light emitting device 200 of Embodiment 2 includes a cover member 50 disposed to cover the lateral surfaces of the light emitting element 10 and the lateral surfaces of the phosphor member 30 while exposing the upper surface of the phosphor member 30, and a light shielding member 60 disposed on the upper surface of the cover member 50 along a portion of the perimeter of the upper surface of the phosphor member 30.

In the light emitting device 200 of Embodiment 2 constructed as above, the lateral surfaces of the light emitting element 10 and the lateral surfaces of the phosphor member 30 are covered with a cover member 50 having a high reflectivity similar to the light emitting device 100 of Embodiment 1. Thus, the light subjected to wavelength conversion by the phosphor member 30, or that in combination with a portion of the light emitted by the light emitting element 10, exits from the upper surface (i.e., light exiting surface) of the phosphor member 30.

In the light emitting device 200 of Embodiment 2, a light shielding member 60 is partially disposed on the cover member 50 along a portion of the perimeter of the upper surface of the phosphor member 30. Thus, in the portion on which the light shielding member 60 is disposed, the exiting light can be sharply reduced as the distance from the light exiting surface increases, and the luminance difference between the light exiting surface and the part where the light shielding member 60 is disposed can be increased.

As such, in the light emitting device 200 of Embodiment 2 the light emission at a portion of the perimeter of the light exiting surface can sharply decrease as the distance from the light exiting surface increases, similar to the light emitting device 100 of Embodiment 1. Accordingly, the light emitting device 200 of Embodiment 2 allows a relatively simple optical system suitably designed to optically control the light exiting from the light emitting device to achieve a sharp cutoff line.

Furthermore, in the light emitting device 200 of Embodiment 2, it is preferable to reduce the distances from the phosphor member 30 to the second, third, and fourth lateral surfaces 50c2, 50c3, and 50c4 on the upper surface 50a of the cover member 50. This can make the boundary of the phosphor member 30 appear sharp-edged in the vicinity of the second, third, and fourth lateral surfaces 50c2, 50c3, and 50c4. In this case, the thickness of the cover member covering the lateral surfaces of the phosphor member 30 (i.e., the distance from the phosphor member 30 to each lateral surface of the cover member in a top view) is preferably set to about 100 μm to about 400 μm. Reducing the thickness of the cover member covering the lateral surfaces of the phosphor member may cause light leakage from the lateral surfaces, but can realize the boundaries along the second, third, and fourth lateral surfaces where the luminance sharply changes on the light emission surface side.

A specific example of the light emitting device of Embodiment 2 will be explained below in detail focusing on the differences from the light emitting device according to Embodiment 1 by using the drawings.

In the light emitting device 200 of Embodiment 2, the substrate 20 has a quadrilateral upper surface 20a and a lower surface 20b each having long sides and short sides. A first electrode 26 and a second electrode 27 are disposed on the upper surface 20a of the substrate 20, and a third electrode 28 and a fourth electrode 29 are disposed on the lower surface 20b of the substrate 20. Interlayer wiring such as vias are provided in the substrate 20 to connect the first electrode 26 and the third electrode 28, and connect the second electrode 27 and the fourth electrode 29. As shown in FIG. 7, the third electrode 28 and the fourth electrode 29 are, for example, substantially quadrilateral, and the light emitting device 200 is connected to an external circuitry via these electrodes.

In the light emitting device 200 of Embodiment 2, the light emitting element is disposed on the upper surface 20a of the substrate 20 such that the four sides of the light emission surface 10a are in parallel with the corresponding sides of the upper surface 20a.

The phosphor member 30 has a quadrilateral upper surface 30a and a lower surface 30b, and is disposed such that the lower surface 30b faces and covers the light emission surface 10a of the light emitting element 10. The upper surface 30a and the lower surface 30b of the phosphor member 30 have the same shape, for example, and the phosphor member 30 is disposed such that all four sides of the lower surface 30b are positioned outward of the corresponding sides of the light emission surface 10a of the light emitting element 10.

The cover member 50 is disposed to cover the lateral surfaces of the light emitting element 10 and the lateral surfaces of the phosphor member 30 while exposing the upper surface of the phosphor member 30. The light emitting device 200 of Embodiment 2 is manufactured by the method described later, for example. The first lateral surface 50c1, the second lateral surface 50c2, the third lateral surface 50c3, and the fourth lateral surface 20c4 of the cover member 50 are respectively substantially coplanar with the first lateral surface 20c1, the second lateral surface 20c2, the third lateral surface 20c3, and the fourth lateral surface 20c4 of the substrate 20 located immediately thereunder, and the lateral surfaces configure as the outer lateral surfaces of the light emitting device 200. Being manufactured by the method described later, the upper surface 50a of the cover member 50 includes a first upper surface 50a1 and a second upper surface 50a2 which have different planar directions. In the upper surface 50a of the cover member 50, the first upper surface 50a1 is the region between the side of the first lateral surface 50c1 and the side of the phosphor member 30 closer to the first lateral surface 50c1 side, and the second upper surface 50a2 is the upper surface 50a excluding the first upper surface 50a1. Furthermore, in the light emitting device 200 of Embodiment 2 manufactured by the method described later, the height of the first upper surface 50a1 from the upper surface 20a of the substrate 20 is lower on the outer edge side (i.e., on the first lateral surface 50c1 side) than on the phosphor member 30 side.

The light shielding member 60 is partially disposed on the first upper surface 50a1 of the cover member 50. The light shielding member 60 is partially disposed on the upper surface 50a of the cover member 50 along the side of the phosphor member 30 on the first lateral surface 50c1 side.

The light emitting device 200 of Embodiment 2 described above includes a light shielding member disposed on the upper surface 50a of the cover member 50 along the side of the phosphor member 30 located closer to the first lateral surface 50c1 side. This can make the boundary in the vicinity along that side of the phosphor member 30 appear sharp-edged, and when used as the light emitting device in a headlight allows a relatively simple optical system to achieve a sharp cutoff line.

A method of manufacturing a light emitting device of Embodiment 2 will be explained below with reference to FIG. 8 and FIGS. 9A to 9G.

Figure 8:
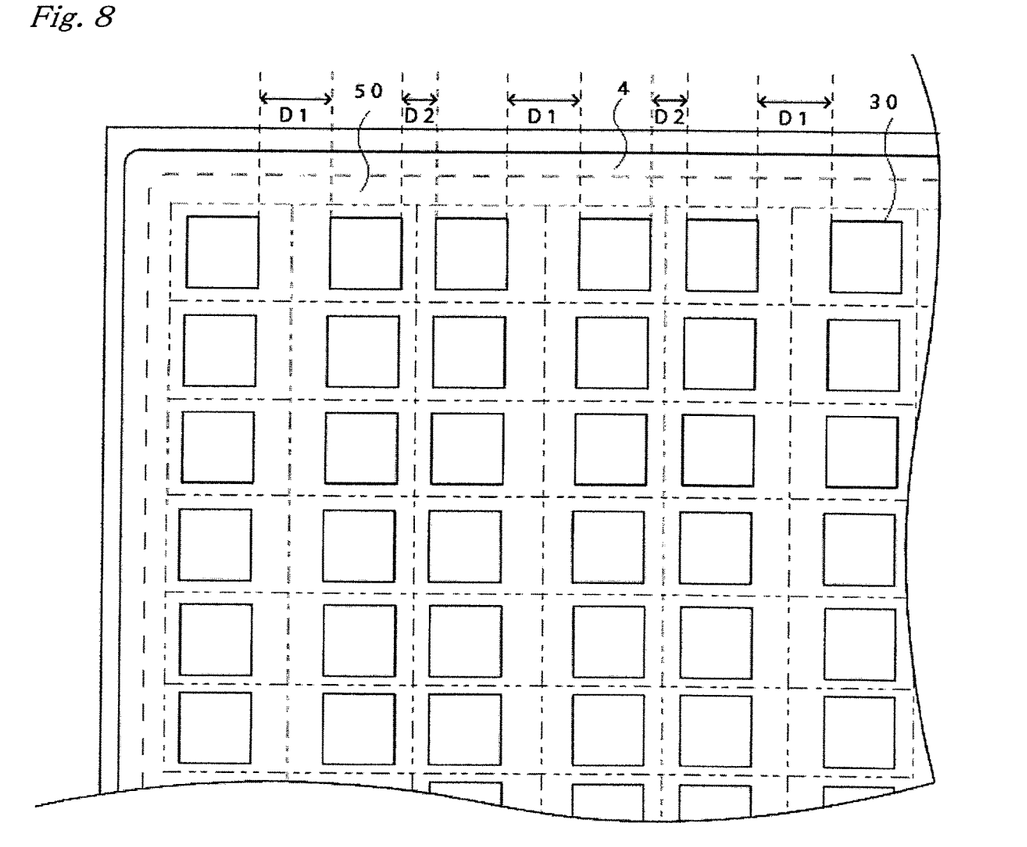
FIG. 8 is a plan view after disposing a cover member in a method of manufacturing a light emitting device according to Embodiment 2.
Figure 9:
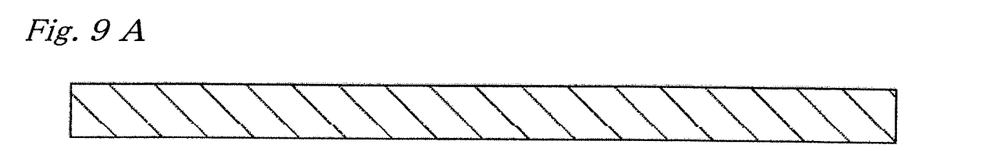
FIG. 9A is a cross-sectional view of a substrate block used in the method of manufacturing a light emitting device according to Embodiment 2.
FIG. 9B is a cross-sectional view after disposing light emitting elements in the method of manufacturing a light emitting device according to Embodiment 2.
FIG. 9C is a cross-sectional view after disposing protective elements in the method of manufacturing a light emitting device according to Embodiment 2.
FIG. 9D is a cross-sectional view after disposing phosphor members in the method of manufacturing a light emitting device according to Embodiment 2.
FIG. 9E is a cross-sectional view after disposing frame members in the method of manufacturing a light emitting device according to Embodiment 2.
FIG. 9F is a cross-sectional view after disposing cover members in the method of manufacturing a light emitting device according to Embodiment 2.
FIG. 9G is a cross-sectional view after disposing light shielding members in the method of manufacturing a light emitting device according to Embodiment 2.

FIGS. 9A to 9G are schematic cross-sectional views each showing a process in the method of manufacturing a light emitting device of Embodiment 2. FIG. 8 is a top view of what is shown in FIG. 9F.

The method of manufacturing a light emitting device of Embodiment 2 includes a light emitting element disposing process (FIG. 9B), a protective element disposing process (FIG. 9C), a phosphor member disposing process (FIG. 9D), a frame member disposing process (FIG. 9E), a cover member disposing process (FIG. 9F), a light shielding member disposing process (FIG. 9G), and a dividing process.

In FIG. 8 and FIGS. 9A to 9G, the same reference numerals denote the same members before and after the light emitting devices are divided into individual pieces.

Light Emitting Element Disposing Process

In the light emitting element disposing process, a substrate 20 in a collective state (hereinafter referred to as a substrate block 20) is provided (FIG. 9A). On the substrate block 20, a plurality (n×m pieces) of light emitting elements are arranged in a matrix of m rows (m is an integer equal to or larger than 1), each row including n pieces (n is an even number equal to or larger than 2). In the present embodiment, in each row, n pieces of light emitting elements are arranged such that the interval between a kth (k is an odd number smaller than n) light emitting element from one end and the (k+1)th light emitting element is a first distance D1. In the example of Embodiment 2 shown in FIG. 8, the interval between the light emitting elements 10 arranged in the first column (i.e., the column at one end) and the light emitting elements 10 arranged in the second column, the interval between the light emitting elements 10 arranged in the third column and the light emitting elements 10 arranged in the fourth column from that end, and the interval between the light emitting elements 10 arranged in the fifth column and the light emitting elements 10 arranged in the sixth column from that end, each have the first distances D1.

In the manufacturing method of Embodiment 2, each light emitting device has a single light emitting element 10. Thus, the light emitting elements 10 in each column are arranged at equal intervals.

Protective element Disposing Process

Subsequently, in the manufacturing method of Embodiment 2, protective elements 90 are disposed for the light emitting elements 10, as needed (FIG. 9C). For example, a protective element 90 is disposed between a kth light emitting element from one end and the (k+1)th light emitting element in each row. In each row, the protective element 90 for the kth light emitting element from one end and the protective element 90 for the (k+1)th light emitting element are disposed next to each other between the kth light emitting element and the (k+1)th light emitting element. In this manner, in each row, a second distance D2 between a (k+1)th light emitting element and the (k+2)th light emitting element can be made smaller than the first distance D1 between a kth light emitting element and the (k+1)th light emitting element.

Phosphor Member Disposing Process

In the phosphor member disposing process, a phosphor member 30 is disposed on the light emission surface of each of the light emitting element 10 provided (FIG. 9D).

Frame Member Disposing Process

In the frame member disposing process, a frame member 4 surrounding the (n×m) pieces of light emitting elements is disposed on the upper surface of the substrate block 20. The method of manufacturing a light emitting device of Embodiment 2 differs from the method of manufacturing a light emitting device of Embodiment 1 in that the frame member 4 is disposed to collectively surround all of the (n×m) areas which will become individual light emitting devices such that no frame member 4 remains on the inside of the individual light emitting device areas when divided into individual devices. Similar to Embodiment 1, the frame member 4 is formed to be lower than the upper surfaces of the phosphor members 30 as shown in FIG. 9E, for example.

Cover Member Disposing Process

In the cover member disposing process, a cover member is disposed in the area surrounded by the frame member 4 to cover the lateral surfaces of the (n×m) pieces of light emitting elements and the lateral surfaces of the phosphor members while forming curved recesses at the upper surface between kth light emitting elements and the (k+1)th light emitting elements which are apart by the first distance (FIG. 9F). Methods being the same as or similar to those in Embodiment 1 can be used to dispose the cover member and adjust the depth (degree of curvature) of the curved recesses formed at the upper surface between the kth light emitting elements and the (k+1)th light emitting elements. Accordingly, the viscosity and the injection amount of the resin are set by taking into consideration the required thickness of the light shielding members 60 formed in the process described later.

Recesses are formed at the upper surface between kth light emitting elements and the (k+1)th light emitting elements in each row also in the case of Embodiment 2. The recesses are normally formed in the shape of a continuous groove between kth columns where kth light emitting elements are arranged and the (k+1)th columns where the (k+1)th light emitting elements are arranged, which result in a continuous groove formed between adjacent light emitting elements. In the example shown in FIG. 8, the curved concave grooves are formed at a surface between the light emitting elements 10 arranged in the first column (i.e., the column at one end) and the light emitting elements 10 arranged in the second column, a surface between the light emitting elements 10 arranged in the third column and the light emitting elements 10 arranged in the fourth column from that end, and a surface between the light emitting elements 10 arranged in the fifth column and the light emitting elements 10 arranged in the sixth column from that end.

Light Shielding Member Disposing Process

In the light shielding member disposing process, in each row, light shielding members are disposed in the curved recesses formed at the upper surface of the cover member between kth light emitting elements and the (k+1)th light emitting elements which are apart by the first distance (FIG. 9G). In the case where a groove-like recess is formed between a kth column and the (k+1)th column, a continuous strip-shape light shielding member is disposed in the groove-like recess. It is also preferable in Embodiment 2 to dispose a light shielding member in a recess or groove-shaped recess such that the edges of the light shielding member substantially coincide with the edges of the phosphor members 30. A method being the same or similar to that in Embodiment 1 can be used to dispose a light shielding member in a recess or groove-like recess.

In the case where the light shielding members need to have a large thickness, the surfaces of the light shielding members may be convex upward. In this case, the viscosity of the resin material to be injected is made relatively high to allow the ends of the injected resin stop at the edges of the phosphor members 30.

Dividing Process

In the dividing process, individual light emitting devices are separated by being cut along the cut lines indicated by the two-dot chain lines in FIG. 8.

A light emitting device of Embodiment 2 can be manufactured by following the processes described above.

As specifically explained based on Embodiments 1 and 2, a light emitting device according to certain embodiment of the present disclosure includes a light shielding member 60 partially disposed on the upper surface 50a of the cover member 50 along the side of the phosphor member 30 closer to the first lateral surface 50c1 side. This can make the boundary of the phosphor member 30 appear sharp-edged in the vicinity along that side of the phosphor member 30, and when used as the light emitting device for a headlight, a sharp cutoff line can be achieved with a relatively simple optical system.

The light emitting devices and methods of manufacturing the light emitting devices according to the embodiments of the present disclosure described can be modified in various ways as described by the specific descriptions of Embodiments 1 and 2 disclosed.

For example, in a light emitting device according to certain embodiment of the present disclosure, external connection terminals can be disposed on the upper surface 20a of the substrate 20 as described by Embodiment 1, or external connection electrodes can be disposed on the lower surface 20b of the substrate 20 as shown by Embodiment 2.

A light emitting device according to an embodiment of the present disclosure can be structured with a plurality of light emitting elements as shown by Embodiment 1, or a single light emitting element as shown by Embodiment 2.

What is claimed is:

1. A method of manufacturing a light emitting device, the method comprising:
    disposing a plurality (n×m pieces) of light emitting elements on an upper surface of a substrate block arranged in m rows (m is an integer equal to or larger than 1), each row including n pieces (n is an even number equal to or larger than 2), where an interval between a kth (k is an odd number smaller than n) light emitting element from one end of rows and a (k+1)th light emitting element has a first distance;
    disposing a phosphor member on each light emission surface of the plurality (n×m pieces) of light emitting elements;
    disposing a frame member on the upper surface of the substrate block so as to surround the plurality (n×m pieces) of light emitting elements;
    disposing a cover member in each area surrounded by the frame member so as to cover lateral surfaces of the plurality (n×m pieces) of light emitting elements and lateral surfaces of the phosphor members while forming recesses at an upper surface between the kth light emitting elements and the (k+1)th light emitting elements which are separated by the first distance such that each of the formed recesses is adjacent to only one of the lateral surfaces of each of the phosphor members disposed respectively on the kth and (k+1)th light emitting elements;
    disposing a light shielding member in each of the formed recesses; and
    dividing into individual light emitting devices by cutting the light shielding members, the cover members, and the substrate block between the light emitting elements that are separated by the first distance.

2. The method of manufacturing a light emitting device according to claim 1, wherein
    the n is an even number equal to or larger than 4, and
    the plurality (n×m pieces) of light emitting elements are disposed in the process of disposing the light emitting elements such that the interval between the (k+1)th light emitting element from one end of the rows and a (k+2)th light emitting element has a second distance which is smaller than the first distance.

3. The method of manufacturing a light emitting device according to claim 1,
    wherein m is an integer equal to or larger than 2, and
    the recesses form grooves across multiple rows between a column where kth light emitting elements are arranged and a column where (k+1)th light emitting elements are arranged.

4. The method of manufacturing a light emitting device according to claim 3,
    wherein in the process of dividing into individual light emitting devise, the light shielding members are cut along a center line of each of the grooves.

5. The method of manufacturing a light emitting device according to claim 1,
    the method further including, before the process of disposing the cover member, respectively disposing two protective elements on the upper surface of the substrate block in each area between the positions where light emitting elements are to be disposed separated by the first distance, or each area between light emitting elements disposed separated by the first distance.

6. A light emitting device comprising:
    a substrate;
    a light emitting element disposed on an upper surface of the substrate;
    a phosphor member having a quadrilateral upper surface and a lower surface opposing the quadrilateral upper surface, and disposed such that the lower surface faces a light emission surface of the light emitting element;
    a cover member disposed to cover lateral surfaces of the light emitting element and lateral surfaces of the phosphor member while exposing an upper surface of the phosphor member; and a light shielding member disposed on an upper surface of the cover member along a portion of a perimeter of the upper surface of the phosphor member, wherein the portion of the perimeter along which the light shielding member is disposed corresponds to one side of the cover member, and a portion of the cover member on which the light shielding member is disposed has a height from an upper surface thereof to the upper surface of the substrate so as to be lower closer to an outer edge side than on a phosphor member side.

7. The light emitting device according to claim 6, wherein the portion of the cover member on which the light shielding member is disposed has a height from the upper surface thereof to the upper surface of the substrate so as to decrease as a distance from the phosphor member increases.

8. The light emitting device according to claim 6, wherein the portion of the upper surface of the cover member on which the light shielding member is disposed has a curved surface.

9. The light emitting device according to claim 6, wherein the light shielding member becomes thicker as the distance from the phosphor member increases.

10. The light emitting device according to claim 6, further comprising a protective element disposed in the cover member between the light shielding member and the substrate.

11. The light emitting device according to claim 6, wherein the light shielding member includes a resin material containing a light absorbing substance.

12. The light emitting device according to claim 6, wherein the cover member includes a resin material containing a light reflecting substance.

* * * * *